(12) United States Patent
Katsuma

(10) Patent No.: US 6,204,671 B1
(45) Date of Patent: Mar. 20, 2001

(54) THERMAL PRINTER AND RESISTANCE DATA MEASURING DEVICE FOR THERMAL HEAD OF THE SAME

(75) Inventor: Nobuo Katsuma, Saitama (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 0 days.

(21) Appl. No.: 09/175,573

(22) Filed: Oct. 20, 1998

Related U.S. Application Data

(62) Division of application No. 08/749,546, filed on Nov. 15, 1996, now Pat. No. 5,852,369.

(30) Foreign Application Priority Data

Nov. 16, 1995 (JP) .................................................... 7-298727
Nov. 16, 1995 (JP) .................................................... 7-298728
Nov. 8, 1996 (JP) .................................................... 8-296017

(51) Int. Cl.[7] ................................................. G01R 27/02
(52) U.S. Cl. ............................................. 324/678; 347/191
(58) Field of Search ............................. 324/678, 711, 324/718, 705, 707

(56) References Cited

U.S. PATENT DOCUMENTS 5,469,068  11/1995  Katsuma .
5,528,276  6/1996   Katsuma .
5,608,333  3/1997   Hayashi .
5,698,987  12/1997  Hayashi .

*Primary Examiner*—Safet Metjahic
*Assistant Examiner*—Vincent Q. Nguyen

(57) ABSTRACT

A thermal head of a thermal printer has plural heating elements arranged along a line and connected in parallel with one another. A respective one of the heating elements is connected to one of plural heat control switches, which are selectively turned on/off for driving the heating elements individually by applying electrical energy to generate heat. To measure resistance data of at least one of the heating elements, a capacitor is connected in parallel with the plural heating elements. A reference resistor is connected in parallel with the plural heating elements and the capacitor. The capacitor is charged, and then discharged via the reference resistor or the one of the heating elements. A capacitor voltage across the capacitor is detected. Discharging time elapsed in a decrease of the capacitor voltage is measured from a predetermined high voltage to a predetermined low voltage while the capacitor is discharged, in association respectively with the reference resistor and the heating elements. Resistance data of the heating elements is determined in accordance with the discharging time respectively of the heating elements with reference to the discharging time of the reference resistor.

4 Claims, 11 Drawing Sheets

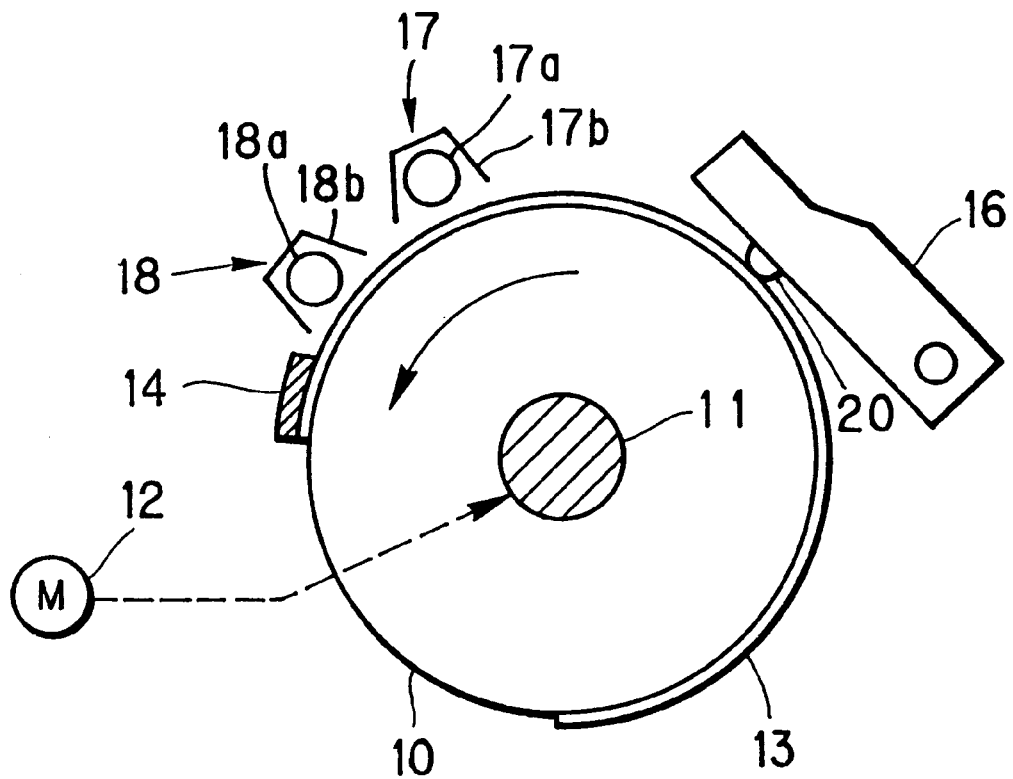
F I G. 1

THERMAL PRINTER AND RESISTANCE DATA MEASURING DEVICE FOR THERMAL HEAD OF THE SAME

This application is a divisional of application Ser. No. 08/749,546, filed on Nov. 15, 1996, now U.S. Pat. No. 5,852,369, patented Nov. 21, 1995, the entire contents of which are hereby incorporated by reference.

BACKGROUND OF THE INVENTION

1. Field of the Invention

The present invention relates to a thermal printer and a resistance data measure device for a thermal head of the same. More particularly, the present invention relates to a thermal printer in which irregularity in performance of heating elements of a thermal head can be overcome in printing operation, and a resistance data measure device for a thermal head of the thermal printer.

2. Description Related to the Prior Art

There are widely used thermal printers including a thermal transfer printer in which ink film is used, and a direct thermal printer in which thermosensitive recording material is heated for directly printing an image.

The color thermal printer of the direct printing is used with a color thermosensitive recording material or recording sheet, in which thermosensitive coloring layers of magenta, yellow and cyan are formed on a support. Selectively to develop colors of the coloring layers, the coloring layers are different in the amount of heat energy (in $mJ/mm^2$) to apply to. The lowest heat energy is required for coloring one of the coloring layers located at the obverse of the recording sheet. Higher heat energy is required for coloring the coloring layers according to the closeness to the support. Once a coloring layer is heated, electromagnetic rays are applied to it to fix it before heat energy for another coloring layer next to be colored is applied. This is for the purpose of destroying the further coloring ability of the present coloring layer to prevent it from being colored beyond desired density.

The thermal head includes an array of heating elements as resistors, which are arranged to record pixels arranged in one line. To record an image of each color thermally, heat energy is applied to the recording sheet as a sum of bias heat energy and image heat energy. The bias heat energy has an amount slightly short of causing the coloring layer to develop the one color, and is applied to the recording sheet during the bias heating at the beginning of recording each one pixel. The image heat energy has an amount determined according to the gradation level of one color, namely coloring density of the pixel to be printed, and is applied to the recording sheet during the image heating which succeeds the bias heating.

To reproduce high gradation, the heating operation is controlled finely. The heating elements of the thermal head need to have an equal resistance for the purpose of precise application of the heat as controlled. It is however inevitable that the heating elements have irregularity of 5–10% in the resistance. If the heating elements are driven for an equal duration, generated heat energy differs between the heating elements due to the differences in the resistance. Irregularity in density is likely to occur in an image being recorded.

U.S. Pat. No. 5,469,068 (corresponding to JP-A 6-79897) discloses a thermal printer in which the resistance of the heating elements is measured for the purpose of preventing occurrence of irregularity in printed density by compensating image data. The thermal printer is provided with a capacitor, of which capacitance is known. The capacitor is charged fully, and then discharged via the heating elements connected thereto. Time for decrease in a capacitor voltage is measured. For example, the decrease of the capacitor voltage down to a half of a power source voltage is checked to measure the discharging time. According to the discharging time and the capacitance of the capacitor, the resistance of the heating elements is calculated in view of a proportional relationship between the discharging time and the resistance of the heating elements.

This prior document also suggests use of a reference resistor to which the capacitor is connected, and of which resistance is known. The capacitor is charged fully, and then discharged via the reference resistor. The discharging time for decrease in the capacitor voltage is measured until coming down to a predetermined voltage. Again the capacitor is charged fully, and discharged via the heating elements. The discharging time for decrease in the capacitor voltage is measured until coming down to the predetermined voltage. According to the resistance of the reference resistor and the discharging times via the reference resistor and the heating elements, the resistance of the heating elements is calculated.

According to U.S. Pat. No. 5,469,068 (corresponding to JP-A 6-79897), the capacitor is fully charged by applying voltage for a predetermined duration, and then discharged down from the capacitor voltage equal to the power source voltage, until the discharging time is measured. To measure the resistance of the heating elements with precision, the duration for the charging operation should be long enough for ensuring the full charging. A problem of the prior art lies in considerable slowness of measuring the resistance of all the heating elements. If the duration for the charging operation is shortened, the capacitor voltage upon the finish of the charging is not kept equal due to the charge having initially remained in the capacitor. Another problem lies in low precision in the measurement of the resistance.

SUMMARY OF THE INVENTION

In view of the foregoing problems, an object of the present invention is to provide a thermal printer in which irregularity in performance of heating elements of a thermal head can be overcome in printing operation, and a resistance data measure device for a thermal head of the thermal printer.

Another object of the present invention is to provide a thermal printer in which resistance of heating elements can be measured precisely and quickly, and a resistance data measure device for a thermal head of the thermal printer.

In order to achieve the above and other objects and advantages of this invention, a thermal head has plural heating elements arranged along a line and connected in parallel with one another. A respective one of the heating elements is connected to one of plural heat control switches. The heat control switches are selectively turned on/off for driving the heating elements individually by applying electrical energy to generate heat. A capacitor is connected in parallel with the plural heating elements. A charging switch is adapted to charging the capacitor A voltage detector detects a capacitor voltage across the capacitor. A reference resistor is connected in parallel with the plural heating elements and the capacitor. An additional switch is connected to the reference resistor. A control circuit controls the heat control switches, the charging switch and the additional switch. The control circuit initially turns on the charging switch to charge the capacitor. The charging switch is turned off to stop charging the capacitor upon an increase of the capacitor voltage to a predetermined high voltage. One selected from a group including the additional switch and the plural heat control switches is thereafter turned on, to discharge the capacitor via the reference resistor or one of the heating elements in association with the selected one being turned on. A timer measures discharging time elapsed in a decrease of the capacitor voltage from the predetermined high voltage to a predetermined low voltage while the capacitor is discharged, in association respectively with the reference resistor and the heating elements. A resistance data determiner determines resistance data of the heating elements in accordance with the discharging time respectively of the heating elements with reference to the discharging time of the reference resistor.

In a preferred embodiment, the resistance data is a ratio of the discharging time of each of the heating elements to the discharging time of the reference resistor, and represents a relative greatness of resistance.

The resistance data measure device is incorporated in a thermal printer in which the heating elements are respectively driven by a drive signal based on bias data and image data, to effect thermal recording to recording material. The thermal printer further includes a compensator for compensating the drive signal associated with the heating elements, in accordance with the resistance data determined by the resistance data determiner.

In a variant, a reference resistor is connected to the charging switch in series. A control circuit controls the heat control switches and the charging switch. The control circuit initially turns on the charging switch to charge the capacitor via the reference resistor, turns off the charging switch to stop charging the capacitor, and thereafter turns on one selected from the plural heat control switches, to discharge the capacitor via one of the heating elements in association with the selected one being turned on. A timer measures charging time elapsed in an increase of the capacitor voltage from a predetermined low voltage to a predetermined high voltage while the capacitor is charged. The timer measures discharging time elapsed in a decrease of the capacitor voltage from the predetermined high voltage to the predetermined low voltage while the capacitor is discharged, in association respectively with the heating elements. A resistance data determiner determines resistance data of the heating elements in accordance with the discharging time with reference to the charging time.

It is preferable in the variant that the control circuit turns off the charging switch upon an increase of the capacitor voltage to the predetermined high voltage while the charging switch is turned on.

BRIEF DESCRIPTION OF THE DRAWINGS

The above objects and advantages of the present invention will become more apparent from the following detailed description when read in connection with the accompanying drawings, in which:

FIG. 1 is an explanatory view in elevation, illustrating a mechanical construction of a color thermal printer;

DETAILED DESCRIPTION OF THE PREFERRED EMBODIMENT(S) OF THE PRESENT INVENTION

Figure 2:
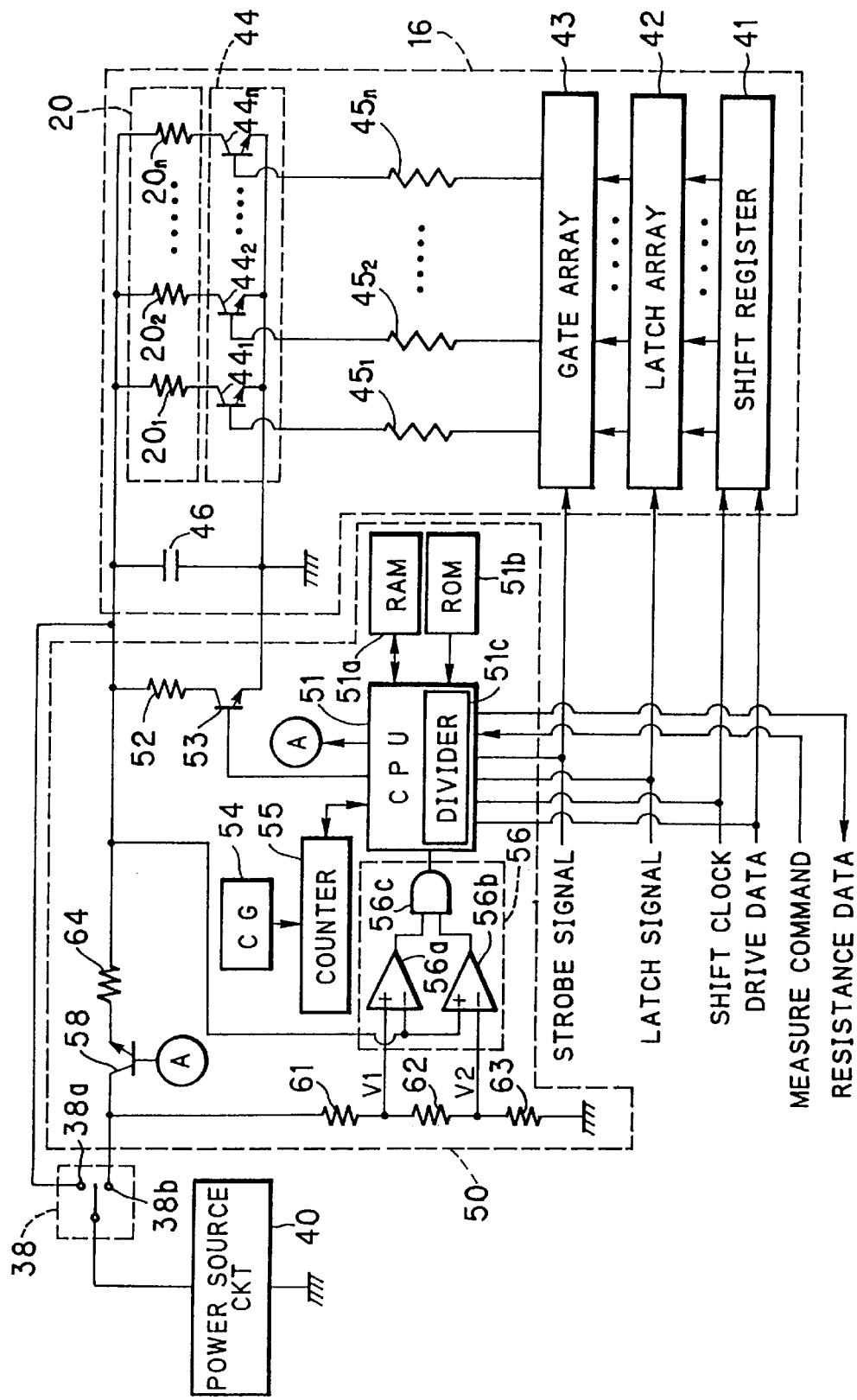
FIG. 2 is a block diagram schematically illustrating a resistance data measure device and circuits relevant to a thermal head.

In FIG. 1, a platen drum 10 is mounted about a rotational shaft 11, and rotated by a stepping motor 12 in a subscanning direction indicated by the arrow. A color thermosensitive recording sheet 13 is mounted on a periphery of the platen drum 10. A front edge of the recording sheet 13 is fixedly retained on the platen drum 10 by a damper 14. The damper 14 is movable between a position on the platen drum 10 for the retention of the recording sheet 13 and a position away from the platen drum 10.

Near to the periphery of the platen drum 10, there are disposed a thermal head 16, a yellow fixing optical device 17, and a magenta fixing optical device 18. In FIG. 2, the thermal head 16 includes a heating element array 20 in which heating elements 201–20n are arranged along one line in a main scanning direction, namely in parallel with the axis of the platen drum 10. At the time of printing, the heating element array 20 is pressed against the recording sheet 13. The yellow fixer 17 includes an ultraviolet lamp 17a and a lamp housing 17b. The lamp 17a emanates ultraviolet rays peaking at the wavelength of 420 nm. The magenta fixer 18 includes an ultraviolet lamp 18a and a lamp housing 18b. The lamp 18a emanates ultraviolet rays peaking at the wavelength of 365 nm.

Figure 3:
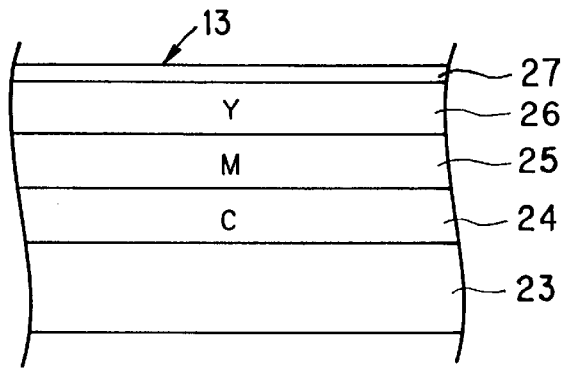
FIG. 3 is an explanatory view in section, illustrating layers of a color thermosensitive recording sheet.

In FIG. 3 illustrating a layered structure of the recording sheet 13, the recording sheet 13 includes a support 23, a cyan coloring layer 24, a magenta coloring layer 25, a yellow coloring layer 26 and a protective layer 27 disposed in the order listed. The magenta coloring layer 25 has optical fixability responsive to ultraviolet rays of a wavelength range of nearly 365 nm. The yellow coloring layer 26 has optical fixability responsive to ultraviolet rays of a wavelength range of nearly 420 nm. Recording operation is effected in the order from the obverse toward the support 23, namely yellow, magenta and cyan. It is also possible to use an alternative recording sheet including the support 23, the cyan coloring layer 24, the yellow coloring layer 26, and the magenta coloring layer 25 disposed in the order listed. With this recording sheet, recording operation is effected in the order magenta, yellow and cyan. Note that in FIG. 3, Y represents the yellow coloring layer 26, M represents the magenta coloring layer 25, and C represents the cyan coloring layer 24.

There are intermediate layers which are disposed between the coloring layers 24–26 for regulating thermal sensitivity of the coloring layers 24–26, but which are not shown in the drawing. The support 23 consist of a piece of opaque coated paper or plastic film. Also transparent plastic film may be used for producing an OHP sheet adapted to an overhead projector (OHP).

Figure 4:
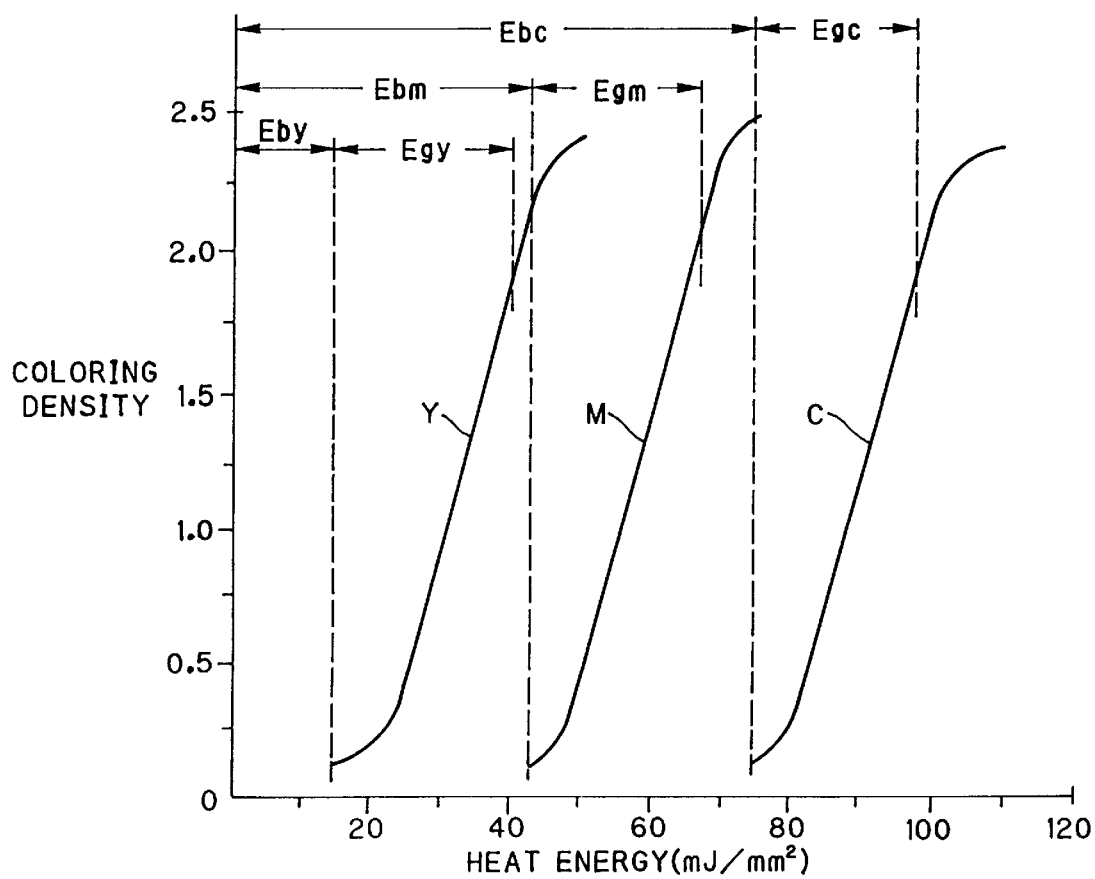
FIG. 4 is a graph illustrating coloring characteristics of the recording sheet.

FIG. 4 illustrates coloring characteristics of the coloring layers 24–26. Higher heat energy is required for coloring the coloring layers 24–26 according to the closeness to the support 23. The lowest heat energy is required for the yellow coloring layer 26. The highest heat energy is required for the cyan coloring layer 24. To record a yellow pixel thermally, heat energy is applied to the recording sheet 13 as a sum of bias heat energy Eby for yellow and image heat energy Egy for yellow.

The bias heat energy Eby has an amount slightly short of causing the yellow coloring layer 26 to develop the yellow color, and is applied to the recording sheet 13 during the bias heating at the beginning of recording each one pixel. The image heat energy Egy has an amount determined according to the gradation level of yellow, namely yellow coloring density of a pixel to be printed, and is applied to the recording sheet 13 during the image heating which succeeds the bias heating. Similarly the bias heating and the image heating are effected by applying magenta bias heat energy Ebm, magenta image heat energy Egm, cyan bias heat energy Ebc and cyan image heat energy Egc.

Figure 5:
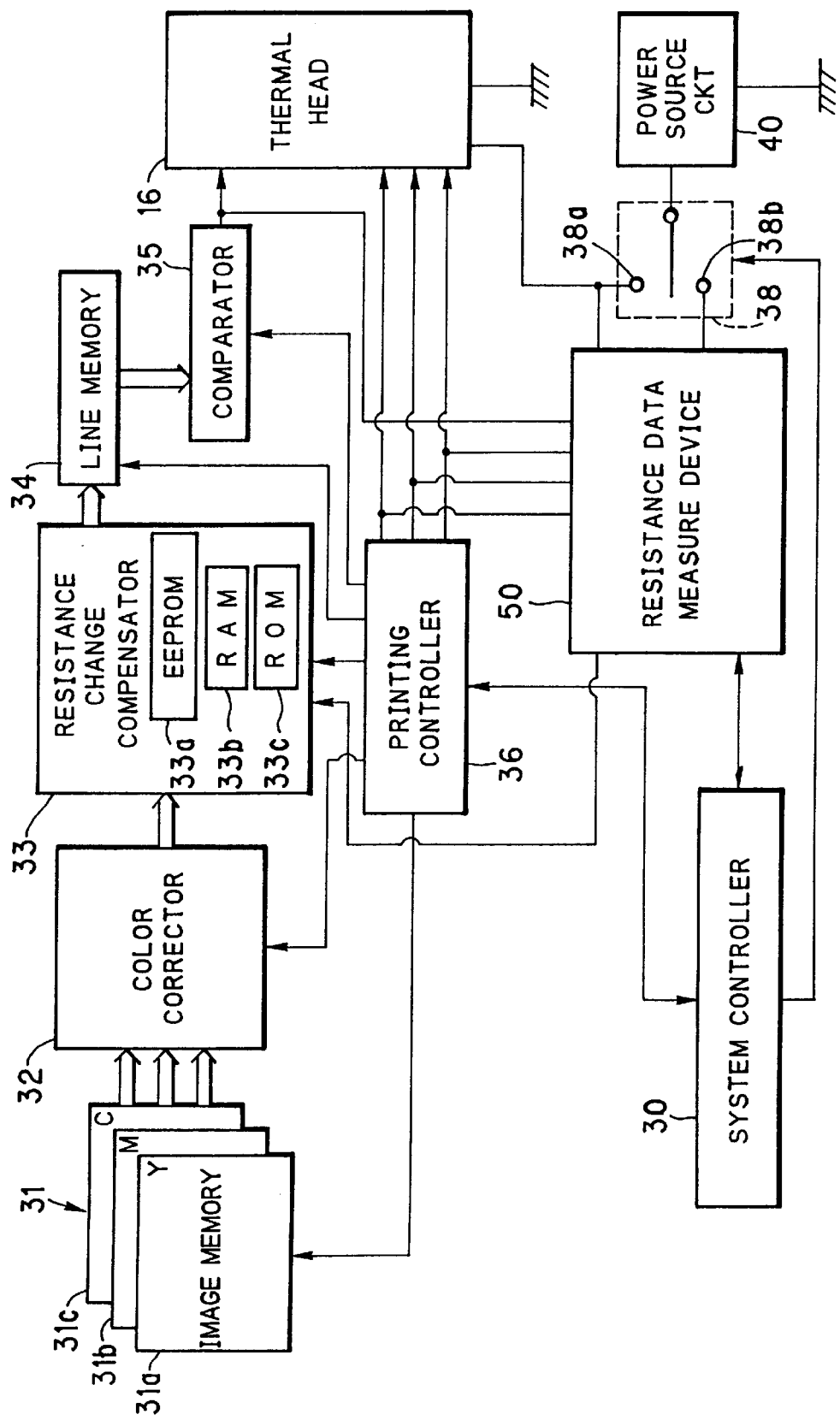
FIG. 5 is a block diagram schematically illustrating an electrical construction of the thermal printer.

FIG. 5 schematically illustrates the color thermal printer. A system controller 30 effects preset sequences, and controls a section for the thermal recording, a resistance data measure device 50, the stepping motor 12, the yellow fixer 17 and the magenta fixer 18. The thermal recording section includes a printing controller 36, and also the thermal head 16, an image memory group 31, a color corrector 32, a resistance change compensator 33, a line memory 34 and a comparator 35, which are sequentially controlled by the printing controller 36.

The image memory group 31 includes a yellow image memory 31a, a magenta image memory 31b and a cyan image memory 31c, which are controlled by a memory controller incorporated in the printing controller 36, for writing and reading of image data. An image to be printed is measured by a scanner according to three-color separation photometry, and converted into image data of 8 (eight) bits per one color to be input to the image memory group 31. Yellow image data is written to the yellow image memory 31a. Magenta image data is written to the magenta image memory 31b. Cyan image data is written to the cyan image memory 31c. In printing operation, the three-color image data of one line to be recorded is read from the image memory group 31, and sent into the color corrector 32.

The color corrector 32 receives the three-color image data, effects the color correction, and sends the resistance change compensator 33 image data of each color to be recorded. Note that it is possible to write Red, Green and Blue image data to the image memory group 31, and to operate the color corrector 32 both for complementary color conversion and for the color correction, so as to obtain the yellow, magenta and cyan image data.

The resistance change compensator 33 includes an EEPROM (electrically erasable programmable read-only memory) 33a, a RAM (read-only memory) 33b and a ROM (random access memory) 33c. EEPROM 33a operates to store resistance data Di (i=1, 2, . . . , n). ROM 33c stores fundamental bias data of each color. The fundamental bias data is compensated according to the resistance data Di. In the course of assembly and adjustment of the thermal printer, the resistance data Di is determined by the resistance data measure device 50 and written to EEPROM 33a.

Inevitably there occurs variety in the resistance between the heating elements 201–20n of the heating element array 20 as actually manufactured no matter precisely their resistance is equally regulated. Changes or irregularities are created in a recorded image due to the variety in the resistance, because heat energy from the heating elements has conspicuous differences causing improper appearance in the image. Errors in the heat energy due to changes in the resistance include an error in the bias heat energy occurring during the bias heating, and an error in the image heat energy occurring during the image heating.

To eliminate bias heat energy error as an error in the bias heating, the resistance change compensator 33 utilizes the resistance data Di of EEPROM 33a, create one-line compensated bias data by compensating the fundamental bias data from ROM 33c, and writes the compensated bias data to RAM 33b. Image heat energy error as an error in the image heating depends on the highness of the image data. Once the one-line image data is written to RAM 33b, the resistance change compensator 33 calculates the image heat energy error in accordance with the image data stored in RAM 33b and the resistance data Di. Again the compensated bias data of RAM 33b is compensated according to the image heat energy error, to create one-line bias data. For the bias heating, the resistance change compensator 33 sends the one-line bias data to the line memory 34. For the image heating, the resistance change compensator 33 reads the one-line image data from RAM 33b, and sends it to the line memory 34.

To the line memory 34, the bias data or the image data for the one line is written. The bias data or the image data for the one line is read from the line memory 34 sequentially pixel by pixel, and sent to the comparator 35. The comparator 35 includes a counter for generating comparison data. In response to a count-up signal from the printing controller 36, the counter steps up the count by one. The number of the grades of the gradation may be 256, so that the counter may generate the comparison data of 1–255. The comparator 35 effects comparison between the bias data or the image data for the one line and a series of the comparison data, and successively pixel after pixel. If the bias data or the image data is greater than the comparison data, then the comparator 35 generates drive data of 1 (one). If the bias data or the image data is smaller than the comparison data, then the comparator 35 generates drive data of 0 (zero).

For the bias heating, the bias data of one line is compared for 255 times with the comparison data of 1–255. The bias data of one pixel is converted to drive data of at most 255 pulses. For the image heating, the image data of the one line is compared for 255 times. The image data of one pixel is converted to drive data of at most 255 pulses. The comparator 35 outputs the one-line drive data in a serial form and sends it to the thermal head 16.

A selector switch 38 is controlled by the system controller 30, and set on the side of a terminal 38a for the thermal head, for direct connection of the thermal head 16 to a power source circuit 40, which supplies electric power to drive the heating elements 201–20n. The selector switch 38 is set on the side of a terminal 38b for operation of resistance measurement. For determination of the resistance data Di of the heating elements 201–20n, the terminal 38b is operated for the resistance data measure device 50 to control the supply of the power to the thermal head 16.

In FIG. 2, the thermal head 16 includes a shift register 41, a latch array 42, an AND gate array 43, a heat control switch array 44 and the heating element array 20. The shift register 41 fetches the one-line serial drive data while shifting it successively upon the shift clock pulses, and converts it to the drive data of a parallel form, as an output toward the latch array 42.

The drive data having the parallel-form from the shift register 41 is latched by the latch array 42 in synchronism with a latch signal, and sent to the gate array 43. A strobe signal for the bias heating is sent to the gate array 43 during the bias heating. A strobe signal for the image heating is sent to the gate array 43 during the image heating. The gate array 43 determines a logical product of the strobe signal and the drive data from the latch array 42 at each bit, and sends the logical product to the heat control switch array 44 via resistors 451–45n. A drive pulse is generated at a width of the strobe signal if the bit has the drive data of 1, and is not generated if the bit has the drive data of 0. The pulse width of the strobe signal is determined according to the characteristic curve of the recording sheet 13. The pulse width of the strobe signal is set greater for the bias heating than for the image heating. Also the pulse width of the strobe signal is set different between the three colors. Note that the shift clock pulse, the latch signal and the strobe signal are generated from the printing controller 36.

The heat control switch array 44 consists of heat control transistors 441–44n as switches respectively associated with the heating elements 201–20n. The heat control transistors 441–44n are turned on when a drive pulse is output from an associated one of the gate array 43. An associated one of the heating elements is energized to apply heat for printing by turning on of one of the heat control transistors 441–44n.

A noise absorbing capacitor 46 is connected in parallel with the heating elements 201–20n. The capacitor 46 absorbs electrical noise occurring through a power source line between the thermal head 16 and the power source circuit 40 disposed inside the thermal printer, and keep regulated the voltage applied to the heating element array 20. The heat energy from the heating elements 202–20n would be changed according to changes of the applied voltage across the heating element array 20. The recording sheet could not be colored at desired density.

The resistance data measure device 50 includes a CPU 51 as a control circuit, a reference resistor 52, an additional transistor 53, a clock oscillator or clock generator (CG) 54, a counter 55 as a timer, a window comparator 56 as a voltage detector, a charging transistor 58 and a resistor 64. The reference resistor 52 has resistance Rs being known. The resistance data measure device 50 also utilizes the capacitor 46 for the noise absorption, and measures the resistance data Di of the heating elements 201–20n. The reference resistor 52 is connected in series with the additional transistor 53. The series of the reference resistor 52 and the additional transistor 53 is connected in parallel with the capacitor 46 of the thermal head 16. The additional transistor 53 is controlled by CPU 51 to be turned on/off in measuring the resistance data Di. The resistance Rs of the reference resistor 52 has a type of high precision and high quality, and has as small errors as 1%. The determination of the resistance data Di does not depend on the resistance Rs of the reference resistor 52, which can be set as desired for design.

The charging transistor 58 is connected between the power source circuit 40 and the capacitor 46 as a charging switch for the capacitor 46. CPU 51 keeps the charging transistor 58 turned off during the printing, and switches the charging transistor 58 on and off during the measurement of the resistance.

The window comparator 56 detects a capacitor voltage Vc at which the capacitor 46 is charged, and is constituted by a first comparator 56a, a second comparator 56b and an AND gate 56c. One electrode of the capacitor 46 is connected to an inverting input terminal of the first comparator 56a and to a non-inverting input terminal of the second comparator 56b. Potential dividing resistors 61, 62 and 63 are connected in series for dividing potential of power supply voltage EH of the power source circuit 40. A non-inverting input terminal of the first comparator 56a is connected to a line between the resistors 61 and 62. An inverting input terminal of the second comparator 56b is connected to a line between the resistors 62 and 63.

A predetermined high voltage V1, which is smaller than EH, is input to a non-inverting input terminal of the first comparator 56a as a reference voltage, which is obtained by potential division of the power supply voltage EH of the power source circuit 40. A predetermined low voltage V2, which is even smaller than V1, is input to an inverting input terminal of the second comparator 56b as a reference voltage, which is obtained by the potential division. Outputs of the comparators 56a and 56b are sent to the AND gate 56c, which outputs the signal CHG and sends it to CPU 51. The signal CHG as an output of the window comparator 56 has a "High" level only when the capacitor voltage Vc across the capacitor 46 is between the predetermined voltages V1 and V2.

While the charging transistor 58 is turned on, the capacitor 46 is supplied with electrical charge by the power source circuit 40 via the resistor 64, and charged. At the printing time, the selector switch 38 is changed over to connect the power source circuit 40 directly to the power source terminal of the thermal head 16. The power supply voltage EH of the power source circuit 40 is applied directly to the heating elements 201–20n. The heating elements 201–20n generate the greater heat energy at one time because the current does not flow along the resistor 64. Time required for the printing is prevented from being the longer.

To measure the discharging time of the capacitor 46, the counter 55 is connected to CPU 51. The clock generator 54 is connected to the counter 55 for generating clock pulses of a constant frequency. A count Ck of the counter 55 is reset by CPU 51 to 0 (zero). CPU 51 controls the counter 55 for starting and stopping of the counting operation.

In the measurement of the discharging time, CPU 51 operates to charge the capacitor 46 according to the signal CHG until the capacitor voltage Vc rises to the predetermined high voltage V1. Then the capacitor 46 is discharged via the reference resistor 52 or a selected one of the heating elements 201–20n. During the discharge, the counter 55 counts the number of clock pulses generated while the capacitor voltage Vc changes from the predetermined high voltage V1 to the predetermined low voltage V2. The count Ck obtained by measuring the reference resistor 52 is discharging time Ts. The count Ck obtained by measuring the heating elements 201–20n is discharging time Txi (i=1, 2, ..., n). The count Ck in either case is written to a RAM 51a. As will be described later, CPU 51 includes a divider 51c which effects arithmetic operation to determine the resistance data Di of the heating elements 201–20n by use of the discharging times Ts and Txi stored in RAM 51a, and sends the resistance data Di to the resistance change compensator 33.

A ROM 51b stores one-line drive data for the purpose of resistance measurement. To measure discharging time via each of the heating elements 201–20n, CPU 51 reads the one-line drive data from ROM 51*b*, to drive only a designated one of the heating elements. The drive data is sent to the thermal head 16. Also CPU 51 generates the shift clock pulse, the latch signal and the strobe signal. To measure discharging time via the reference resistor 52, the additional transistor 53 is turned on.

The operation of the above construction is described now. The resistance data Di is measured at the time of assembly and adjustment of the color thermal printer. When the printer is initially powered, the system controller 30 commands the resistance data measure device 50 to measure the resistance data Di in response to checking selection of the measurement at the selector switch 38.

Figure 6:
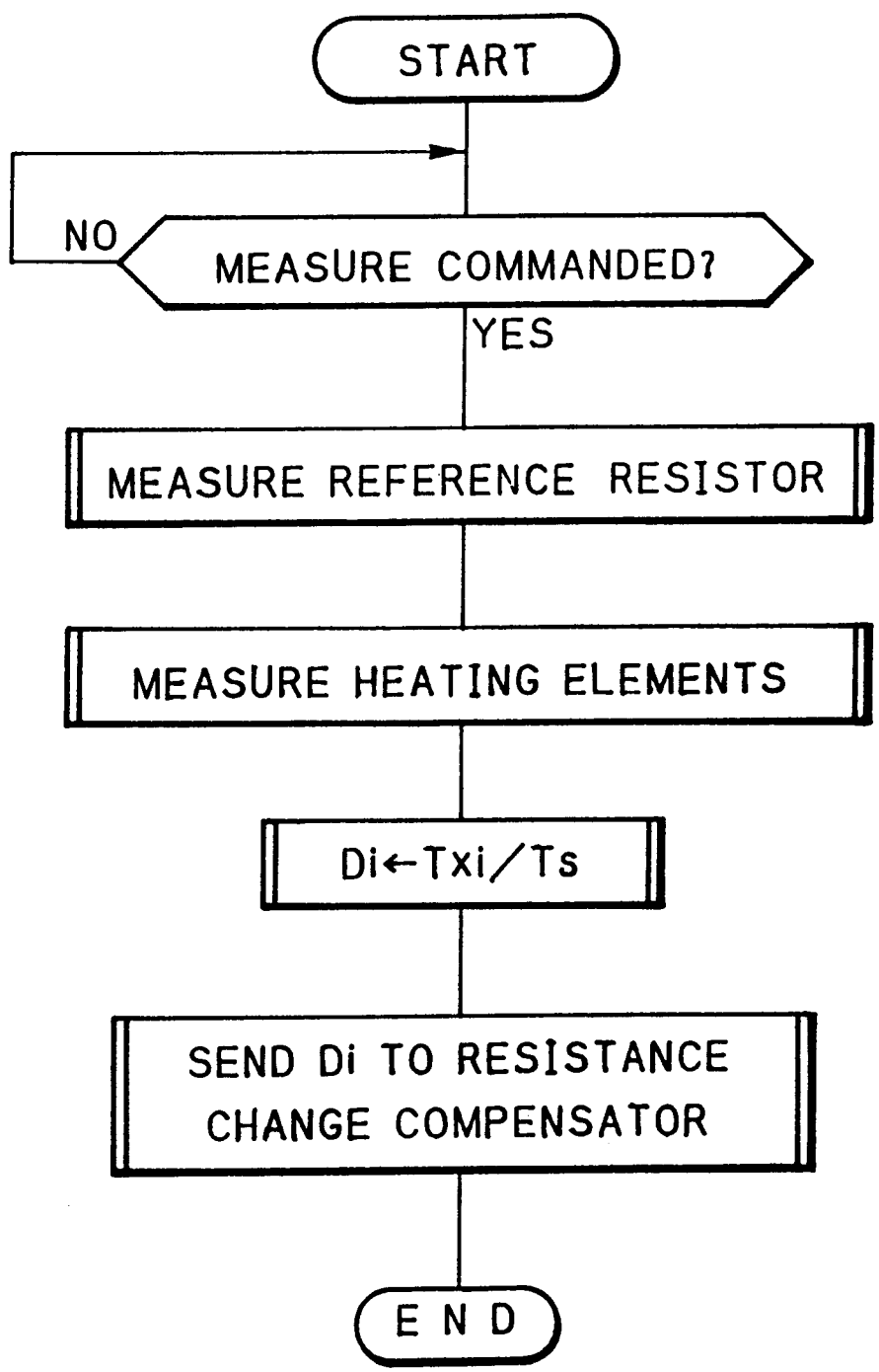
FIG. 6 is a flow chart illustrating determination of resistance data.
Figure 7:
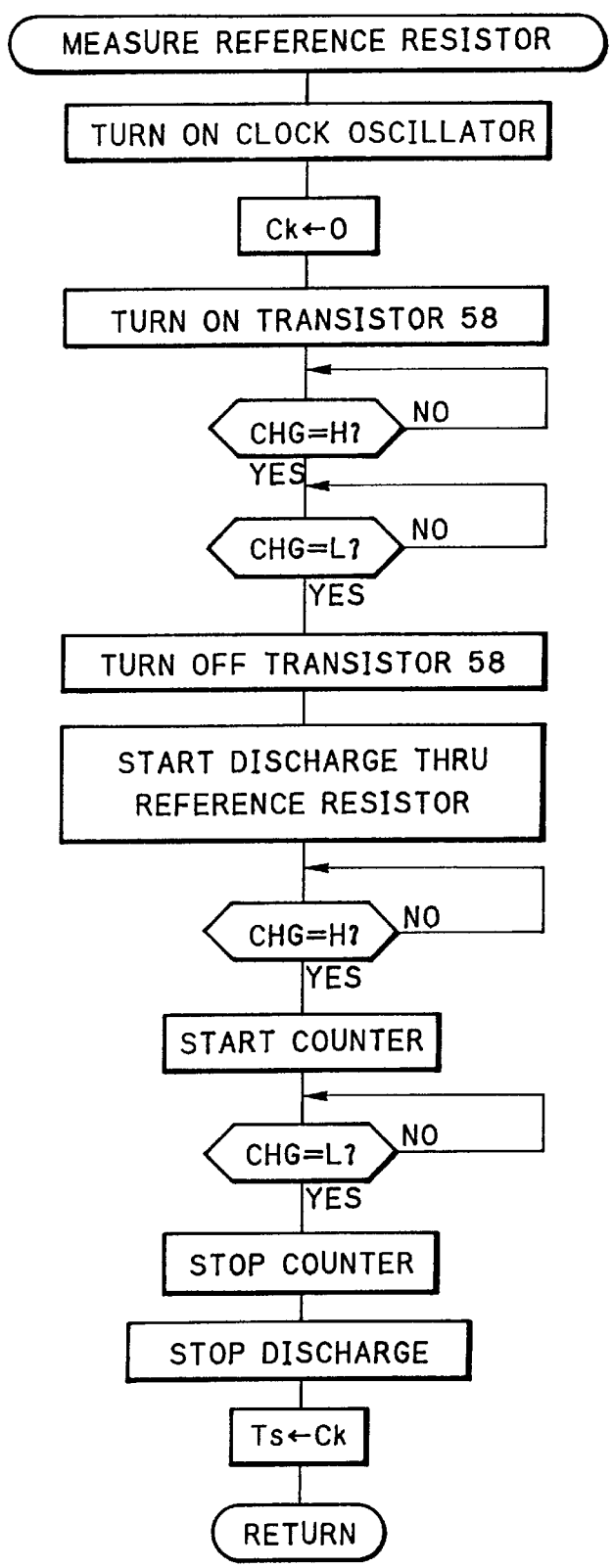
FIG. 7 is a flow chart illustrating measurement of discharging time via the reference resistor.
Figure 8:
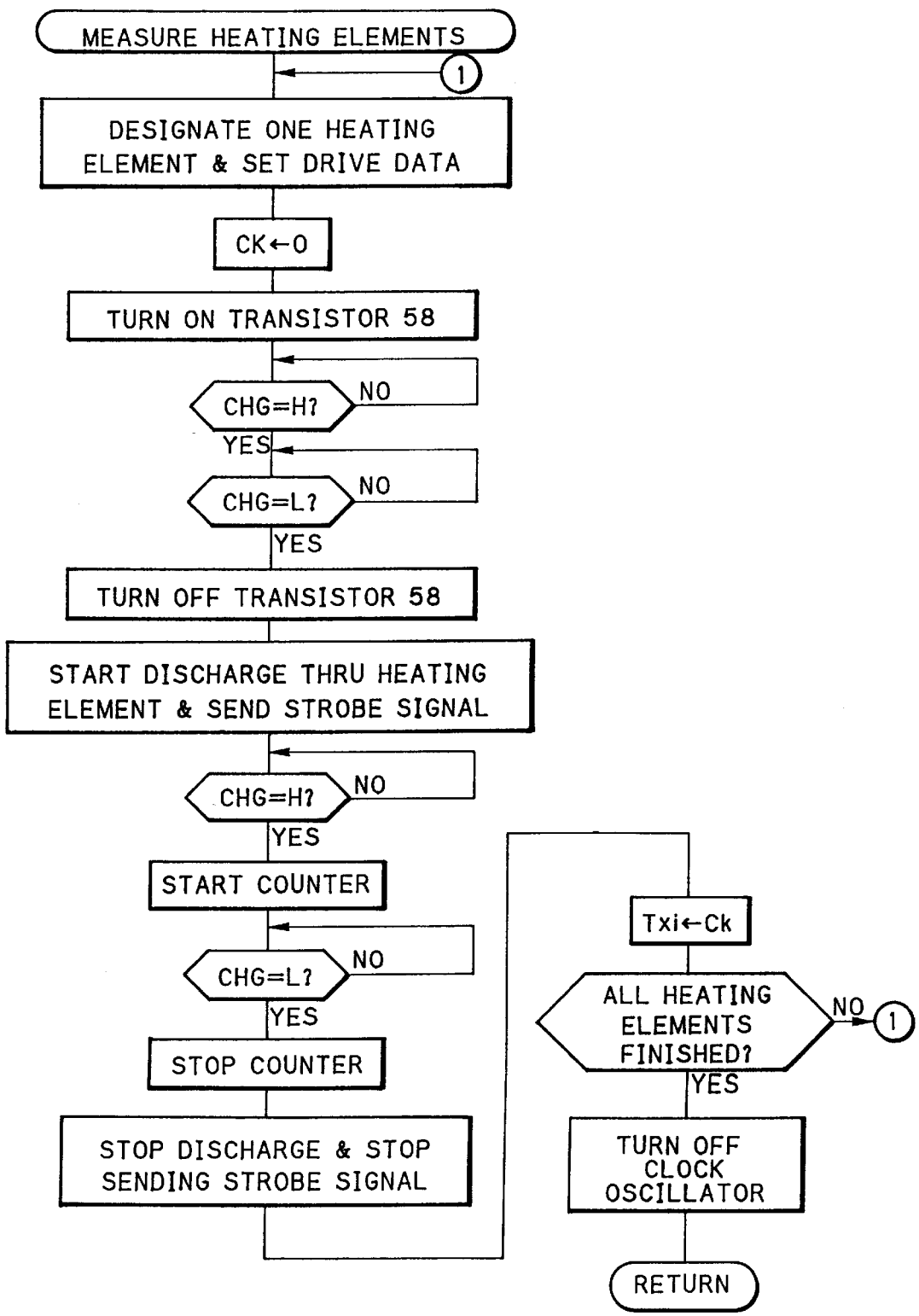
FIG. 8 is a flow chart illustrating measurement of discharging time via each heating element.

When the measurement of the resistance data Di is commanded, CPU 51 effects the sequences of FIGS. 6, 7 and 8 to measure the resistance data Di of the heating elements 201–20*n*. At first CPU 51 operates for the measurement of the reference resistor 52, by measuring the discharging time Ts of the capacitor 46 via the reference resistor 52. In FIG. 7, CPU 51 turns on the clock generator 54, which sends the clock pulse to the counter 55 at the constant period.

Figure 9:
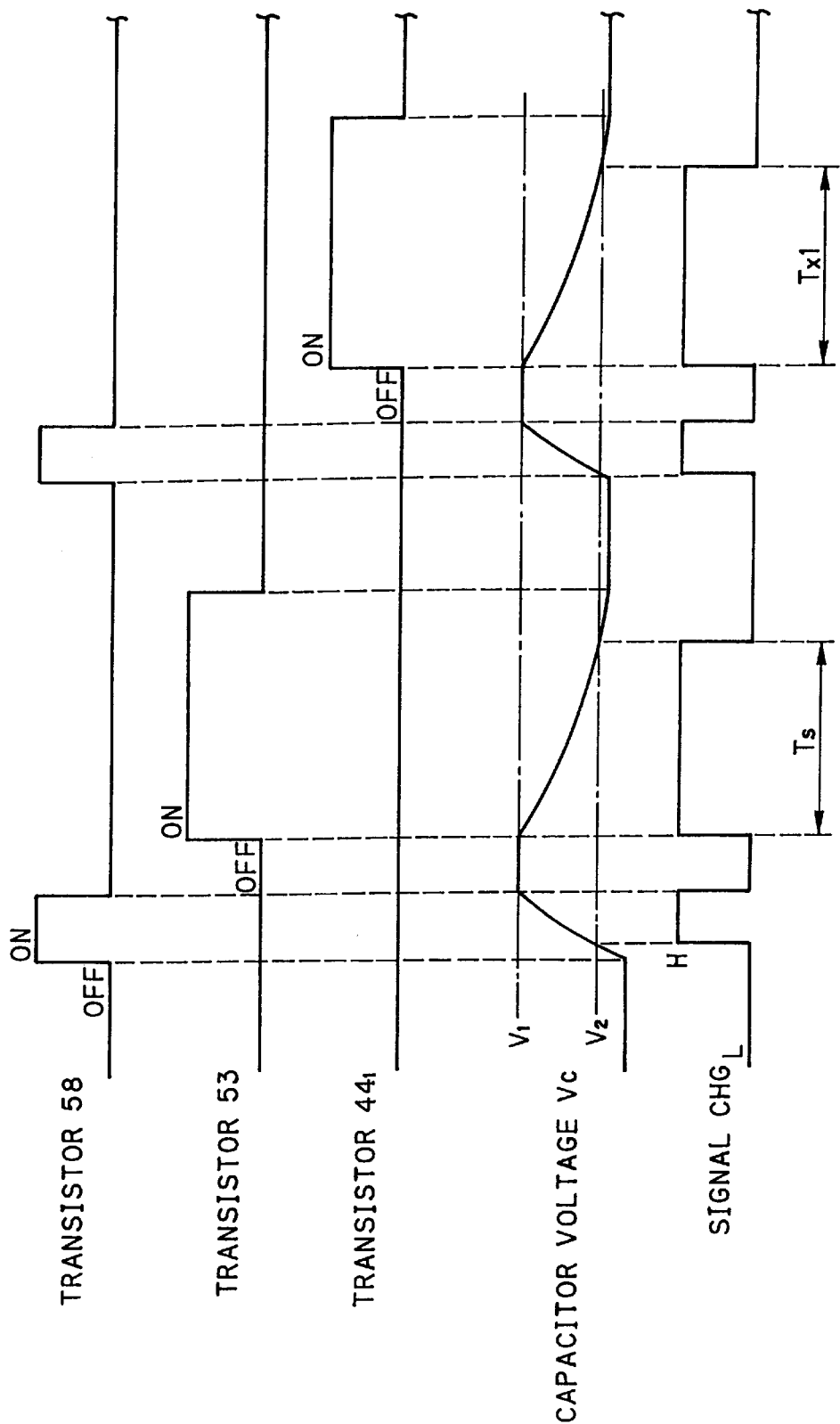
FIG. 9 is a timing chart illustrating signal waveforms during measurement of the discharging times.

Then CPU 51 resets the count Ck of the counter 55 as 0 (zero), and turns on the charging transistor 58. The thermal head 16 is supplied with current by the power source circuit 40 via the resistor 64. Also the capacitor 46 is charged. In FIG. 9, the capacitor voltage Vc across the capacitor 46 gradually increases at a ratio of change according to the resistance of the resistor 64. Upon coming of the capacitor voltage Vc over the predetermined low voltage V2, the signal CHG from the window comparator 56 changes from the "Low" level to the "High" level. In the course of further charging, the capacitor voltage Vc comes to the predetermined high voltage V1, namely slightly over the predetermined high voltage V1. In response the signal CHG becomes "Low". Immediately after the signal CHG becomes "Low", CPU 51 turns off the charging transistor 58, to stop-charging the capacitor 46.

Note that the capacitor 46 can be pre-discharged in preparatory fashion by turning on the heat control transistors 441–44*n* of the heat control switch array 44 before the charging transistor 58 is turned on. It is possible to avoid an erroneous operation in which the capacitor 46 would start being charged with the capacitor voltage Vc accidentally higher than the predetermined low voltage V2.

It is possible to minimize the duration for charging the capacitor 46, as the capacitor 46 stops being charged upon coming of the capacitor voltage Vc to the predetermined high voltage V1. The charging time depends on the capacitance of the capacitor 46, resistance of the resistor 64, the power supply voltage EH and the predetermined high voltage V1. According to the present embodiment, the charging time is 2 msec. After the stop of the charging, CPU 51 turns on the additional transistor 53 connected to the reference resistor 52. In response, current flows between the reference resistor 52 and the capacitor 46, which is discharged via the reference resistor 52.

The capacitor voltage Vc across the capacitor 46 is gradually lowered by the discharge. When the capacitor voltage Vc becomes slightly lower than the predetermined high voltage V1, the signal CHG becomes "High". In response, CPU 51 sends a command to the counter 55 to start counting. The counter 55 increments the count Ck by one each time one clock pulse is sent from the clock generator 54.

In the course of discharging the capacitor 46, the capacitor voltage Vc across the capacitor 46 comes down to the predetermined low voltage V2. In response the signal CHG becomes "Low". The CPU 51 sends a stop command to the counter 55, to stop the counter 55 from counting. According to the present embodiment, the discharging time of the change of the capacitor voltage Vc from the predetermined high voltage V1 to the predetermined low voltage V2 is 10 msec.

After the stop of the counter 55, CPU 51 turns off the additional transistor 53 to stop the discharge of the capacitor 46. Then CPU 51 reads the count Ck from the counter 55, sets it for the discharging time Ts, and writes it to RAM 51*a*. The discharging time Ts is a duration lapsed while the capacitor voltage Vc across the capacitor 46 changes from the predetermined high voltage V1 to the predetermined low voltage V2 during the discharge via the reference resistor 52.

After the discharging time Ts is stored, CPU 51 effects the sequence for measuring the discharging time of the capacitor 46 via the heating elements 201–20*n*. At first CPU 51 measures the heating element 201. In FIG. 8, CPU 51 sends one-line drive data to the shift register 41 in synchronism with the shift clock pulses. The one-line drive data used presently has 1 (one) only at a bit associated with the heat control transistor 441, to turn on the heat control transistor 441 and turn off the heat control transistors 442–44*n*. Then CPU 51 sends the latch signal to the latch array 42, which latches the one-line drive data as set in the shift register 41.

After the latch signal is sent, CPU 51 resets the count Ck of the counter 55 as 0 (zero), and then turns on the charging transistor 58. Again the capacitor 46 is charged. In a manner similar to the reference resistor 52, the charging operation is stopped as soon as the capacitor voltage Vc becomes the predetermined high voltage V1.

After the charging, CPU 51 sends the strobe signal to the gate array 43 of the thermal head 16. The gate array 43 is provided by the latch array 42 with the drive data for turning on the heat control transistor 441 and turning off the heat control transistors 442–44*n*. Upon supply of the strobe signal from CPU 51, the gate array 43 sends a drive pulse to the heat control transistor 441. Only the heat control transistor 441 is turned on for the current to flow from the capacitor 46 to the heating element 201. The capacitor 46 is discharged via the heating element 201.

The capacitor voltage Vc across the capacitor 46 is gradually lowered by the discharge. When the capacitor voltage Vc becomes slightly lower than the predetermined high voltage V1, the signal CHG becomes "High". Like the operation to measure the discharging time Ts at the reference resistor 52, CPU 51 sends the start command to the counter 55, to measure the discharging time. When the capacitor voltage Vc comes down to the predetermined low voltage V2, the signal CHG becomes "Low". CPU 51 sends the stop command to the counter 55, to stop measuring the-discharging time.

After the counter 55 stops counting, CPU 51 stops sending the strobe signal, turns off the heat control transistor 441, and stops discharge via the heating element 201. The count Ck is read, and written to RAM 51*a* as a discharging time Tx1 of the heating element 201. The discharging time Tx1 is time of the change of the capacitor voltage Vc from the predetermined high voltage V1 down to the predetermined low voltage V2 during the discharge of the capacitor 46 via the heating element 201.

CPU 51 starts the measurement of the heating element 202 next. CPU 51 provides the shift register 41 with one-line drive data in synchronism with the shift clock pulse. The one-line drive data is set to turn on the heat control transistor 442 and turn off the heat control transistors 441 and 443–44n. CPU 51 sends the latch array 42 the latch signal to latch the one-line drive data having been set in the shift register 41.

After the drive data is latched, the capacitor 46 is charged and discharged via the heating element 202 in a similar manner to the heating element 201. A discharging time Tx2 is measured according to the change in the signal CHG, and written to RAM 51a. Repetitively discharging times Tx3, Tx4, . . . , Txn are measured with respect to the heating elements 203–20n, and are written to RAM 51a.

As described above, the discharging times Ts and Tx1–Txn associated with the reference resistor 52 and the heating elements 201–20n are measured. In charging the capacitor 46, the capacitor voltage Vc is detected by the window comparator 56. The charging of the capacitor 46 is stopped upon rise of the capacitor voltage Vc to the predetermined high voltage V1. This is effective in shortening durations required for measurement of the reference resistor 52 and the heating elements 201–20n. It is possible for example to spend only 7 seconds in measuring the 512 heating elements. In the present embodiment, the discharging time is measured according to the detection of the capacitor voltage Vc at the window comparator 56. The capacitor voltage Vc can be maintained at the predetermined high voltage V1 at the beginning of the measurement. No error occurs in the measurement, as there are no changes in the power supply voltage or no irregularity in the capacitor voltage.

The capacitor 46 is prevented from being fully charged, as the capacitor voltage Vc across the capacitor 46 is detected to limit the maximum at the predetermined high voltage V1. It is possible to lower the voltage applied to the heating elements 201–20n during the discharge, and to reduce the electrical stress to the heating elements 201–20n in the measurement. The heating elements 201–20n are prevented from degradation. Note that the reference resistor 52 is measured before measuring the heating elements 201–201n, but may be measured after measuring all the heating elements 201–20n.

After the/measurement of the discharging time Txi (i=1, 2, . . . , n) is finished for all the heating elements 201–20n, CPU 51 reads the discharging times Ts and Txi from RAM 51a. The divider 51c as a resistance data determiner calculates the resistance data Di (i=1, 2, . . . , n) for each of the heating elements 201–20n according to the formula:

$$Di=Txi/Ts.$$

The resistance data Di as determined is sent from CPU 51 to the resistance change compensator 33, and written to EEPROM 33a. The resistance data Di itself is not resistance of the heating elements 201–20n, but represents a relative greatness of the resistance of the heating elements 201–20n.

The definition above of the resistance data Di is described now in detail. The capacitor 46 is charged up to a certain voltage E being higher than the predetermined high voltage V1, and is discharged via the reference resistor 52 having the resistance Rs. Let the capacitor 46 have capacitance C. A relationship between the capacitor voltage Vc across the capacitor 46 and a discharging time t is expressed as:

$$Vc=E\cdot\exp(-t/Rs\cdot C) \quad (1)$$

Let t1 be time taken for the capacitor voltage Vc to come down to the predetermined high voltage V1 in the discharge of the capacitor 46 via the reference resistor 52. Let t2 be time taken for the capacitor voltage Vc to come down to the predetermined low voltage V2 in the discharge via the reference resistor 52. The predetermined voltages V1 and V2 are expressed as follows:

$$V1=E\cdot\exp(-t1/Rs\cdot C) \quad (2)$$

$$V2=E\cdot\exp(-t2/Rs\cdot C) \quad (3)$$

The discharging time Ts is equal to a difference (t2−t1) of time, and thus is expressed as Formula (4). The resistance Rs is expressed as Formula (5).

$$Ts=t2-t1=C\cdot Rs\cdot\ln(V1/V2) \quad (4)$$

$$Rs=Ts/[C\cdot\ln(V1/V2)] \quad (5)$$

The predetermined voltages V1 and V2 are supplied by division of the potential of the power supply voltage EH. V1 and V2 can be defined by use of coefficients E1 and E2:

$$V1=E1\cdot EH;\ V2=E2\cdot EH$$

Formula (5) is rewritten by use of a coefficient K1 depending on resistance of the resistors 61–63 and irrespective of the power supply voltage EH:

$$Rs=K1\cdot Ts \quad (6)$$

where K1=1/[C·ln(E1/E2)].

Similarly, resistance Rxi (i=1, 2, . . . , n) of the heating elements 201–20n is expressed as:

$$Rxi=K1\cdot Txi \quad (7)$$

where K1=1/[C·ln(E1/E2)].

Formulae (6) and (7) result in the following formula, from which the resistance Rxi is obtained in accordance with the resistance Rs.

$$Rxi=Txi/Ts\cdot Rs \quad (8)$$

The resistance Rxi of the heating elements 201–20n does not depend on the power supply voltage EH at the measuring time. It is possible precisely to determine the resistance Rxi even if the power supply voltage EH changes with time, or changes each time of measuring one of the heating elements.

The heat energy errors depends on irregularity in the resistance Rxi of the heating elements 201–20n, but can be compensated for without use of the resistance Rxi. In the color thermal printer, the ratio between the discharging time Ts via the reference resistor 52 and the discharging time Txi via the heating elements 201–20n without determining the resistance Rxi, on the basis of Formula (8). The resistance Rxi is proportional to Txi/Ts, so that Txi/Ts is used as data Di. This is an advantage, as it is possible in view of economy to eliminate operation and time for directly determining the resistance Rxi.

Now operation of the printing is described. At first, image data of yellow, magenta and cyan of an image to be printed is written to the image memory group 31. A manual operating panel (not shown) connected to the system controller 30 is operated to command printing. The selector switch 38 is switched to the side of the thermal head. The heating elements are driven by the power source circuit 40 at the power supply voltage EH.

The system controller 30 sends the printing command to the printing controller 36. The printing controller 36 sends the resistance change compensator 33 a command for compensation of the three-color bias data. According to the resistance data Di (i=1, 2, . . . , n) of the heating elements 201–20n written to EEPROM 33a, the resistance change compensator 33 compensates the fundamental bias data, which may be "240", for yellow, to produce compensated bias-data of the heating elements 201–20n. Let Dm be average of the resistance data Di. It is preferable for example to obtain differences between the average resistance data Dm and the resistance data Di, and to compensate the fundamental bias data according to the data differences, for producing the compensated bias data.

If the resistance data Di is smaller than the average resistance data Dm, an amount of generated heat would be greater. Then the compensated bias data is set "230". Furthermore the average resistance data Dm is multiplied by resistance of the reference resistor 52 to obtain average resistance, to regulate a head voltage from the power source circuit 40. Note that it is possible to use maximum resistance data instead of the average resistance data Dm, and effect subtraction between "240" and a value proportional to a difference between the resistance data Di and the maximum resistance data.

Also for magenta and cyan, the resistance change compensator 33 compensates the fundamental bias data according to the resistance data Di (i=1, 2, . . . , n) of the heating elements 201–20n, to produce compensated bias data of the heating elements 201–20n. The compensated bias data of the three colors is written to RAM 33b. Thus the bias heat energy error, which is caused by irregularity in resistance of the heating elements 201–20n is compensated.

After the compensated bias data of the three color is written to RAM 33b, the printing controller 36 starts feeding the recording sheet 13, of which the front edge is retained on the periphery of the platen drum 10 by the clamper 14. The platen drum 10 is rotated to wind the recording sheet 13 about the platen drum 10.

The platen drum 10 is caused to make intermittent rotation step by step as predetermined, until the front edge of a recording region of the recording sheet 13 comes to the thermal head 16. The thermal head 16 is swung down to press the heating element array 20 against the recording sheet 13. Then an image starts being printed. At first, the three-color image data of the first line is read from the image memory group 31, and sent to the color corrector 32. The yellow image data of the first line is subjected to the color correction in the color corrector 32 by taking the three-color image data into consideration, and written to RAM 33b of the resistance change compensator 33.

When the yellow image data of the first line is written to RAM 33b, the resistance change compensator 33 adjusts the compensated bias data for yellow by use of the yellow image data and the resistance data Di, to remove an energy error in the image heating. Accordingly the bias data of the first line of the yellow image is created. The image heat energy error is greater in proportion to greatness of the image data, which heightens the number of times of driving the heating elements in the image heating. The bias heat energy in accordance with the bias data being created is compensated by the resistance data Di and the yellow image data. The bias heat energy is not necessarily equal to the bias heat energy Eby predetermined for the yellow.

The bias data for one line is sent to the line memory 34 successively pixel after pixel, and written to it. After writing the one-line bias data for all its pixels, the one-line bias data is read from the line memory 34 successively pixel after pixel, and sent to the comparator 35. The printing controller 36 causes a counter of the comparator 35 to generate the comparison data of 1 (one).

The comparator 35 compares the bias data being input respectively with the comparison data of 1 (one). If the bias data is equal to or greater than the comparison data of 1 (one), the comparator 35 generates the bias drive data of 1 (one). If not, the comparator 35 generates the bias drive data of 0 (zero). The bias drive data of one line as obtained is output serially and sent to the thermal head 16. The serial drive data is converted by the shift register 41 into a parallel form of the bias drive data.

The bias drive data of the parallel form is latched in the latch array 42, which in turn sends the bias drive data of the parallel form to the gate array 43. After the latching at the latch array 42, the printing controller 36 sends the gate array 43 the bias strobe signal for yellow. The gate array 43 determines a logical product of the drive data of one line and the bias strobe signal from the selector switch 38.

When the bias drive data is 1 (one), the bias drive pulse as wide as the bias strobe signal is sent to an associated one of the transistors in the heat control switch array 44 through an output of the gate array 43 associated with the bias drive data. The bias data is not compensated to the value 0 (zero), so that any of the heat control transistors 441–44n receives the first one of the bias drive pulses. The heat control transistors 441–44n switch on the heating elements 201–20n of the heating element array 20 while the bias drive pulses are input to them. The heating elements 201–20n are driven simultaneously and heated.

During the application of heat caused by the first one of the bias drive pulses, the printing controller 36 incrementally steps the counter of the comparator 35, which is caused to generate the comparison data of 2 (two). Reading from the line memory 34 is effected for the second time. The one-line bias data is read from the line memory 34 successively pixel after pixel, and sent to the comparator 35. In the procedure as described above, a second set of the bias drive pulses is produced for the one line after heating caused by the first set of the bias drive pulses, to drive the heating elements 201–20n at the same time.

Similarly bias drive pulses are created by use of the comparison data of 2–255, to drive the heating elements 201–20n. Each of the heating elements 201–20n is driven at times corresponding to the yellow bias data, at most at 255 times. If the yellow bias data is 248, then a corresponding one of the heating elements is driven at 248 times during the bias heating. The heat energy is applied to a position of one first line of the recording sheet 13 at an amount of addition/subtraction of the bias heat energy error and the image heat energy error to/from the bias heat energy Eby.

After the bias heating, a first line of the yellow image data is read from RAM 33b of the resistance change compensator 33, and written to the line memory 34. Then the first line of the yellow image data is read from the line memory 34 pixel after pixel, and sent to the comparator 35. In a manner similar to the bias drive data, the comparator 35 compares the yellow image data being input respectively with the comparison data of 1 (one). If the yellow image data is equal to or greater than the comparison data of 1 (one), the comparator 35 generates the image drive data of 1 (one). If not, the comparator 35 generates the image drive data of 0 (zero). The image drive data of one line as obtained is output serially and sent to the thermal head 16.

The image drive data of one line is converted to image drive pulses at the thermal head 16 by use of the image strobe signal from the printing controller 36. If the image drive data is 0 (zero), then no image drive pulse is generated. The heating elements 201–20n of the heating element array 20 are selectively caused to heat by the image drive pulses of the one line by means of the heat control transistors 441–44n.

Similarly image drive pulses are created by use of the comparison data of 2–255, to drive the heating elements 201–20n selectively. Each of the heating elements 201–20n is driven at times corresponding to the yellow image data, to generate heat. If the yellow printing is desired at the highest density in a pixel, then a corresponding one of the heating elements 201–20n is driven at 255 times during the image heating. If the yellow printing is desired at the lowest density in a pixel, then a corresponding one of the heating elements 201–20n is not driven.

This being so, the recording sheet 13 is subjected to the bias heating and the image heating, and provided with the coloring heat energy corresponding to the yellow image data. According to the characteristic curve in FIG. 4, the yellow coloring layer 26 is colored at the density according to the image data, to print a dot within a pixel being rectangular. If the equal yellow image data is printed with two heating elements being different in resistance, the equal heat energy can be generated from the two heating elements, to color the yellow coloring layer 26 at the equal density.

When the first line of the yellow image is recorded, the platen drum 10 is rotated stepwise by one line. The three-color image data for a second line is read from the image memory group 31. The yellow image data is written to RAM 33b of the resistance change compensator 33. In a manner similar to the first line, the resistance change compensator 33 compensates the compensated bias data fQr yellow written in RAM 33b, in accordance with the yellow image data of the second line and the resistance data Di. The bias data is obtained, and is used in the bias heating of a position on the recording sheet 13 of the second line. After the bias heating, the yellow image data of the second line from RAM 33b is written to the line memory 34. The yellow image data of the second line from RAM 33b is read from the line memory 34, and used in effecting the image heating of the second line. The second line is recorded on the recording sheet 13.

Similarly third, fourth and fifth lines and so on of the yellow image are recorded successively. After recording the yellow image, ultraviolet rays of 420 nm are applied to the recording sheet 13 by the yellow fixer 17. The yellow coloring layer 26 is optically fixed.

The platen drum 10 makes one rotation, again to move the recording region to the thermal head 16. A magenta image is recorded to the cyan coloring layer 24 line by line. Each pixel is recorded by combination of the bias heating and the image heating. In the bias heating, magenta bias data is used after compensation by means of the magenta image data and the resistance data Di. After recording the magenta image, ultraviolet rays of 365 nm are applied to the recording sheet 13 by the magenta fixer 18. The magenta coloring layer 25 is optically fixed.

The platen drum 10 makes another rotation to place the recording region to the bottom of the thermal head 16. A cyan image is recorded to the cyan coloring layer 24 line by line. In the bias heating, cyan bias data is used after compensation by means of the cyan image data and the resistance data Di. There is no operation of optical fixation of the cyan coloring layer 24. After finishing the cyan recording, the recording sheet 13 is exited to a tray of the printer.

A full color image is recorded on the recording sheet 13 in 256 steps of the gradation for each of the three colors. No irregularity in the density occurs in the full color image even with the irregularity existing in the resistance of the heating elements 201–20n.

The resistance data Di is determined after finishing measurement of the discharging time of all the heating elements. Also it is possible to determine the resistance data Di each time of measuring the discharging time of one of the heating elements. Instead of the resistance data Di, resistance as obtained may be used, and compared with an idealized resistance of an originally designed resistor to calculate a resistance difference. The driving condition of the heating elements may be compensated according to the resistance difference. In the above embodiment, the reference resistor 52 is externally attached to the thermal head 16. Alternatively one of the heating elements can be used as a reference resistor.

Another preferred embodiment is hereinafter described, in which the resistance data Di is obtained from charging time and discharging time. Elements similar to those of the above embodiment are designated with identical reference numerals.

Figure 10:
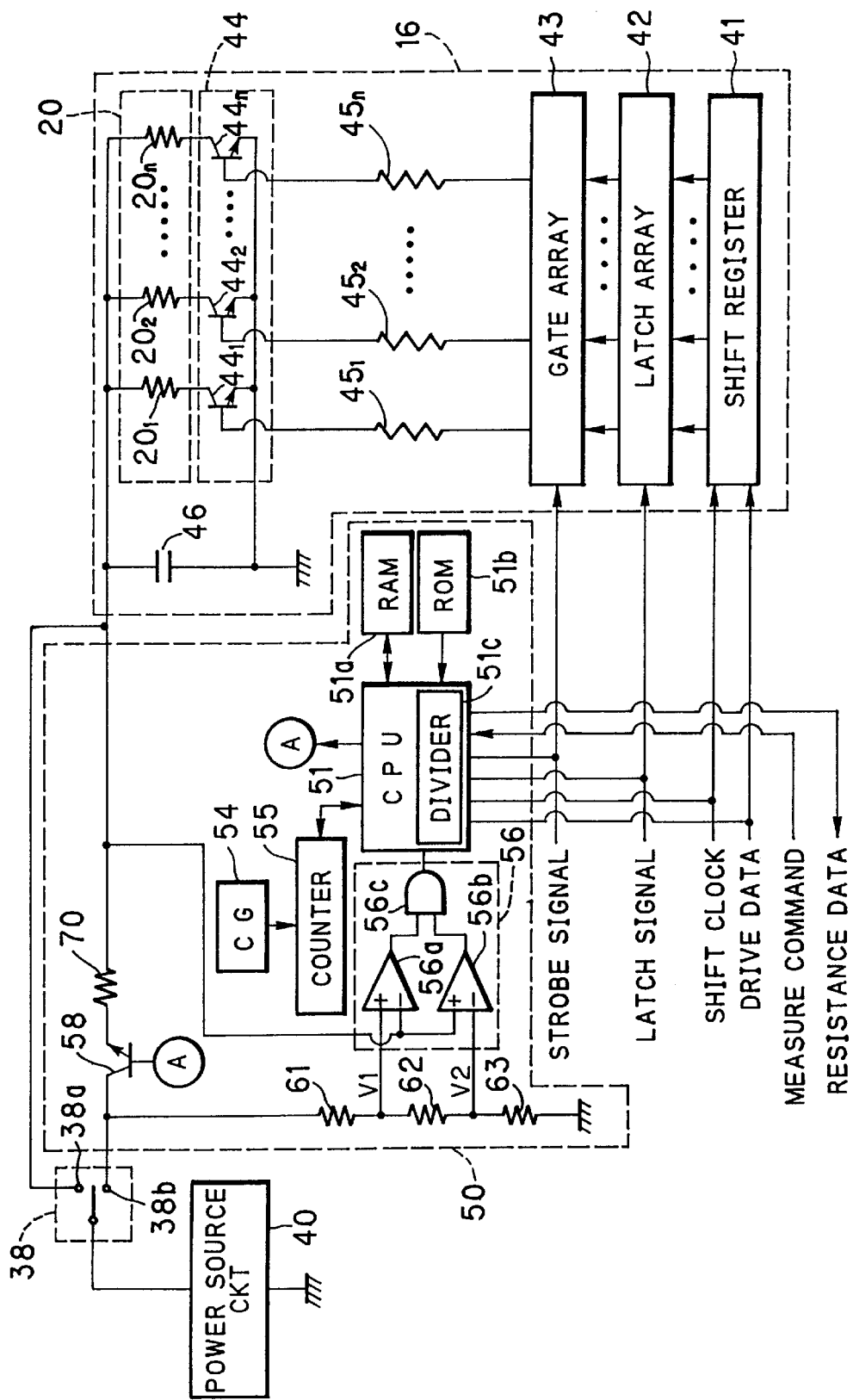
FIG. 10 is a block diagram schematically illustrating another preferred resistance data measure device in which charging time and discharging time are measured.

The resistance data measure device 50 in FIG. 10 is similar to that of FIG. 2, but has a reference resistor 70 instead of the resistor 64 and does not include the additional transistor 53 and the reference resistor 52. A resistance Rq of the reference resistor 70 has a type of high precision and high quality similar to the reference resistor of the above embodiment, and has as small errors as 1%. The determination of the resistance data Di does not depend on the resistance Rq of the reference resistor 70, which can be set as desired for design.

The resistors 61–63 have such resistance that the predetermined voltages V1 and V2 are determined as $$V1 = \tfrac{3}{4} \cdot EH;\quad V2 = \tfrac{1}{4} \cdot EH$$

for the purpose of simplifying an equation for obtaining the resistance data Di.

CPU 51 measures a charging time and a discharging time of the capacitor 46 by use of the counter 55. When the charging time is measured, CPU 51 turns on the charging transistor 58, charges the capacitor 46 via the reference resistor 70, and causes the counter 55 to count the number of generated clock pulses in accordance with signal CHG while the capacitor voltage Vc comes from the predetermined low voltage V2 to the predetermined high voltage V1. The count Ck of the counter 55 is written to RAM 51a as a charging time Tq.

CPU 51 measures the discharging time Txi (i=1, 2, . . . , n) of the change of the capacitor voltage Vc from the predetermined high voltage V1 down to the predetermined low voltage V2 during the discharge of the capacitor 46 via each of the heating elements 201–20n. Each time after the measurement of the charging time Tq and the discharging time Txi (i=1, 2, . . . , n) for one of the heating elements 201–20n, the divider 51c calculates the resistance data Di (i=1, 2, . . . , n) for each of the heating elements 201–20n according to the formula:

$$Di = Txi/Tq.$$

Note that it is also possible to store the charging time Tq and discharging time Txi obtained from the heating elements 201–20n in RAM 51a, and obtain the resistance data Di after the discharging time Txi of all the heating elements 201–20n.

Figure 11:
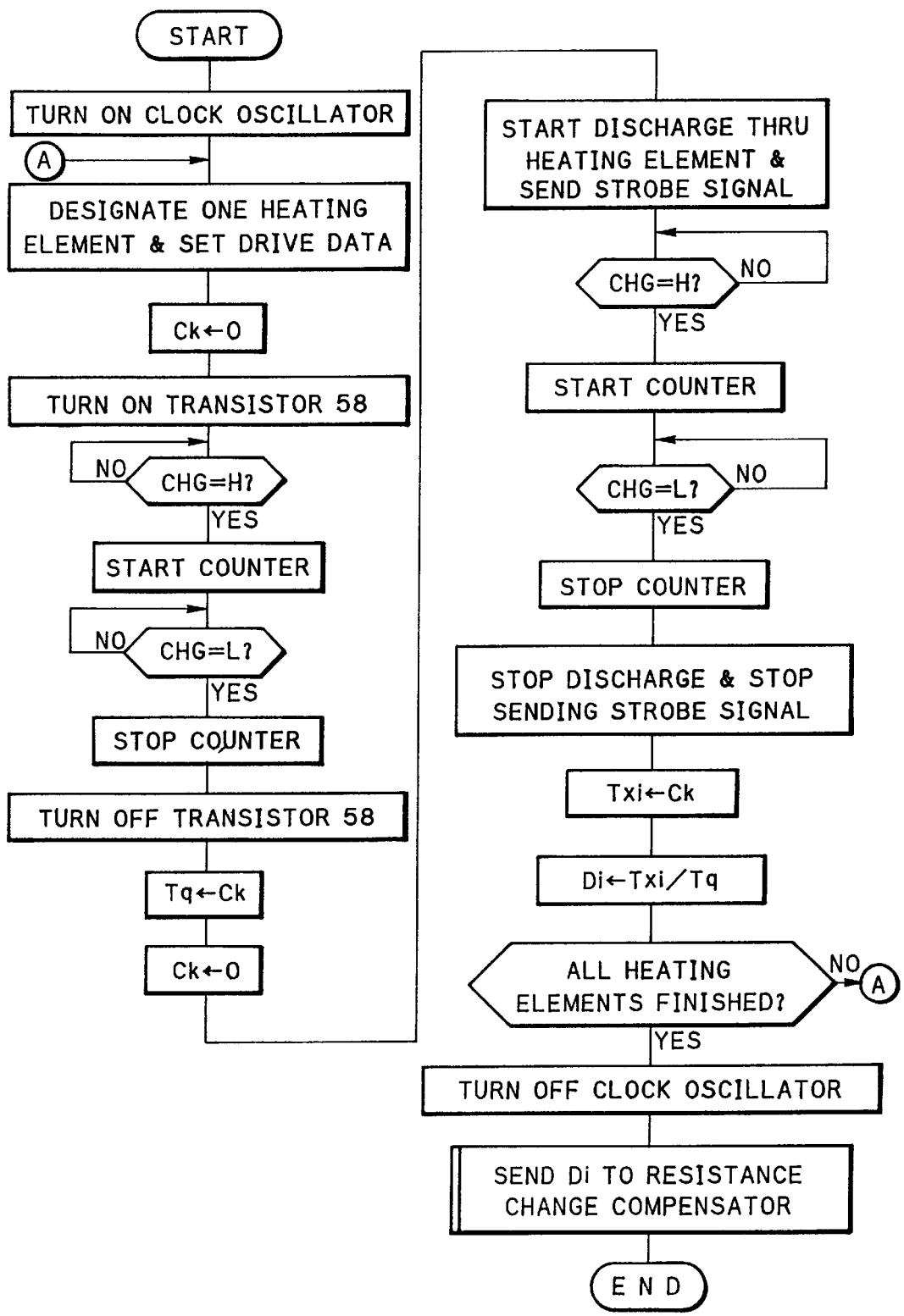
FIG. 11 is a flow chart illustrating determination of resistance data according to the resistance data measure device of FIG. 10.

In the resistance data measure device 50 of FIG. 10, CPU 51 determines the resistance data Di of the heating elements 201–20n by following the routine of FIG. 11. CPU 51 starts the measurement for the first time to measure the heating element 201. CPU 51 resets the counter 55 for the count Ck to have 0 (zero), and turns on the charging transistor 58. The thermal head 16 is supplied with power by the power source circuit 40 via the reference resistor 70, to charge the capacitor 46.

Figure 12:
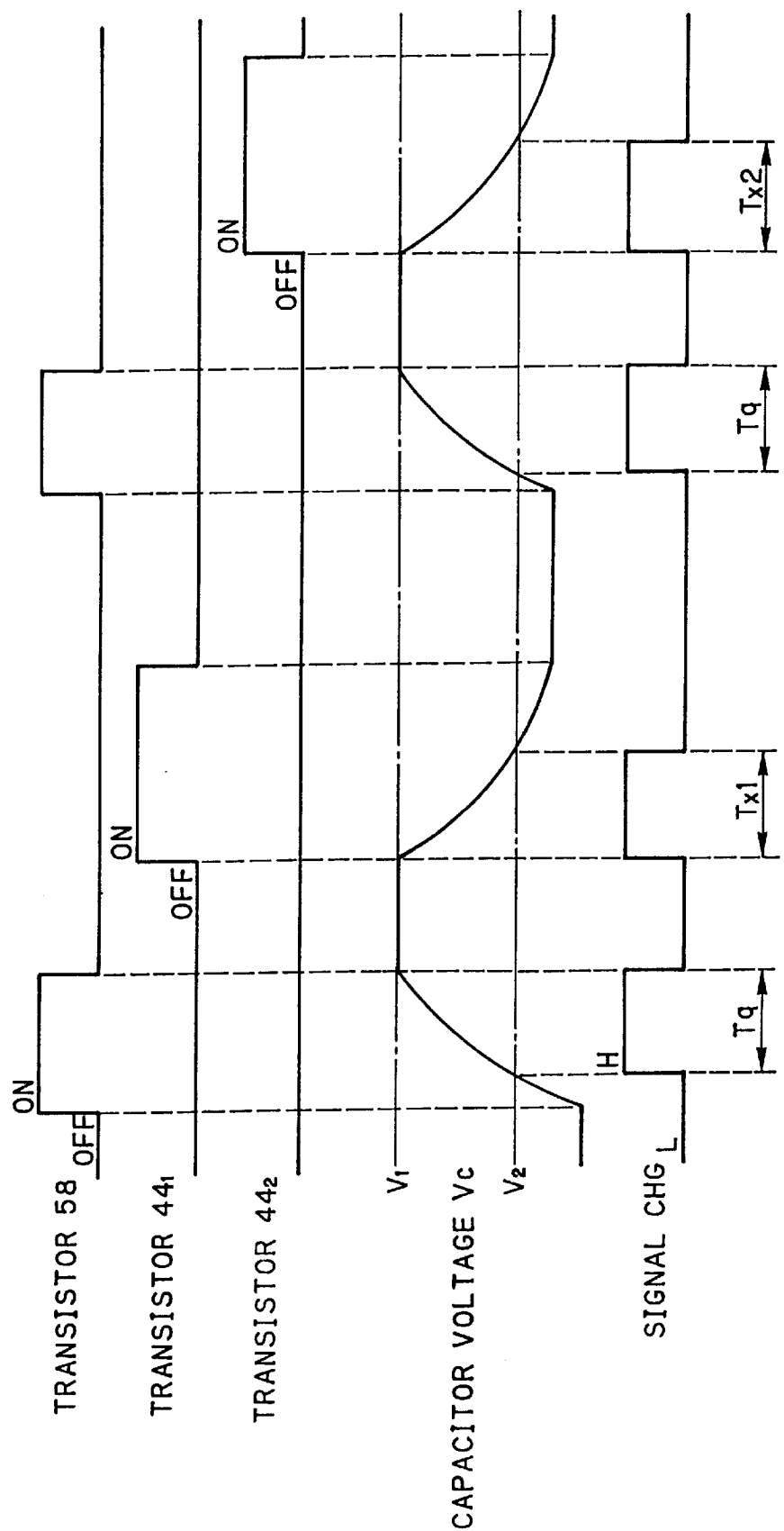
FIG. 12 is a timing chart illustrating signal waveforms during measurement of the charging and discharging times.

In FIG. 12, the capacitor voltage Vc across the capacitor 46 increases at a ratio of change according to the resistance Rq of the reference resistor 70. When the signal CHG comes over the predetermined low voltage V2 and becomes "High", the counter 55 is started to measure the charging time. When the capacitor voltage Vc comes slightly over the predetermined high voltage V1 during the charging and the signal CHG becomes "Low", CPU 51 stops the measurement of the charging time.

The charging time depends on the capacitor 46, the resistance Rq of the reference resistor 70, the power supply voltage EH and the predetermined high voltage V1, and is 10 msec. according to the present embodiment. After the stop of the charging, CPU 51 reads the count Ck from the counter 55, and sets the count Ck as the charging time Tq, and writes it to RAM 51a.

CPU 51 resets the count Ck as 0 (zero), and turns on only the heat control transistor 441, to start discharge the capacitor 46 via the heating element 201. When the signal CHG comes slightly below the predetermined high voltage V1 and becomes "High", CPU 51 starts the counter 55 to start measurement of the discharging time. During the discharge, the signal CHG comes slightly below the predetermined low voltage V2 and becomes "Low". CPU 51 stops the counter 55 to stop the measurement of the discharging time.

CPU 51 stops the discharge, and reads the count Ck from the counter 55, and sets the count Ck as the discharging time Tx1, and writes it to RAM 51a. Then CPU 51 reads the charging time Tq and discharging time Tx1 from RAM 51a, and calculates resistance data D1 (=Tx1/Tq) associated with the heating element 201.

The resistance data D1 itself is not the resistance of the heating element 201, but relatively represents highness of the resistance of the heating element 201. The resistance data D1 is written to RAM 51a.

CPU 51 effects measurement for the second time for the purpose of obtaining resistance data D2 associated with the heating element 202. In a manner similar to the first time, the charging time Tq of the capacitor 46 is measured via the reference resistor 70 in accordance with the changes in the signal CHG. The discharging time Tx2 related to the heating element 202 is measured. The resistance data D2 (=Tx2/Tq) is calculated from the charging time Tq and discharging time Tx2 as obtained, and is written to RAM 51a. Similarly CPU 51 effects measurement for the third, fourth, . . . , nth times, and obtains resistance data D3, D4, . . . , Dn associated with the heating elements 203–20n.

The determination of the resistance data Di is described now indetail. The capacitor 46 is charged up to the power supply voltage EH via the reference resistor 70. Let the capacitor 46 have the capacitance C. A relationship between the capacitor voltage Vc across the capacitor 46 and a charging time t is expressed as:

$$Vc = EH \cdot \{1 - \exp(-t/Rq \cdot C)\} \quad (11)$$

Let t3 be time taken for the capacitor voltage Vc to come up to the predetermined high voltage V1 in the charge of the capacitor 46 via the reference resistor 70. Let t4 be time taken for the capacitor voltage Vc to come up to the predetermined low voltage V2 in the charge of the capacitor 46 via the reference resistor 70 (t4<t3). The predetermined voltages V1 and V2 are expressed as follows:

$$V1 = EH \cdot \{1 - \exp(-t3/Rq \cdot C)\} \quad (12)$$

$$V2 = EH \cdot \{1 - \exp(-t4/Rq \cdot C)\} \quad (13)$$

The charging time Tq is equal to a difference (t3−t4) of time, and thus is expressed as Formula (14). The resistance Rq is expressed as Formula (15).

$$Tq = t3 - t4 = C \cdot Rq \cdot \ln\{(EH-V2)/(EH-V1)\} \quad (14)$$

$$Rq = Tq/[C \cdot \ln\{(EH-V2)/(EH-V1)\}] \quad (15)$$

The resistance Rxi is defined in a manner similar to Formula (7) in modification according to the capacitance C and the predetermined voltages V1 and V2, and is expressed by Formula (16).

$$Rxi = Txi/\{C \cdot \ln(V1/V2)\} \quad (16)$$

According to Formulae (15) and (16), a relationship between the resistance Rq of the reference resistor 70 and the resistance Rxi is expressed as:

$$Rxi = Txi/Tq \cdot Rq/K2 \quad (17)$$

where $K2 = \{\ln(V1/V2)\}/[\ln\{(EH-V2)/(EH-V1)\}]$.

In relation to Formula (17), a coefficient K2 depends on resistance of the resistors 61–63 and irrespective of the power supply voltage EH. The coefficients E1 and E2 are used again to define V1 and V2:

$$V1 = E1 \cdot EH; \quad V2 = E2 \cdot EH.$$

Therefore, $$K2 = \{\ln(E1/E2)\}/[\ln\{(1-E2)/(1-E1)\}]$$

The resistance Rxi of the heating elements 201–20n does not depend on the power supply voltage EH at the measuring time. It is possible precisely to determine the resistance Rxi. If E1 and E2 meet $$E1^2 - E2^2 - E1 + E2 = 0,$$

namely E1/E2=(1−E2)/(1−E1) where E1>E2 then the coefficient K2 is 1 (one), to simplify arithmetic operation of obtaining the resistance Rxi. In the present embodiment, the resistance of the resistors 61–63 is determined to meet $$E1 = \tfrac{3}{4}; \quad E2 = \tfrac{1}{4}$$

then K2=1. The resistance Rxi of the heating elements 201–20n is obtained from the following formula:

$$Rxi = Txi/Tq \cdot Rq \quad (18)$$

It is unnecessary to calculate the resistance Rxi of the heating elements 201–20n. The resistance Rxi is proportional to Txi/Tq of which the discharging time Txi is obtained from the heating elements 201–20n, and the charging time Tq is obtained from the reference resistor 70. Hence the Txi/Tq is used as the resistance data Di.

It is consequently possible to shorten the durations required for measurement of the heating elements 201–20n. Only 10 seconds is spent in measuring the 512 heating elements. There is only a slight interval between the discharging time and the charging time being measured, so that the precision in the measurement can be heightened.

In the above embodiments, the number of the bias drive pulses are changed to compensate for the heat energy errors including the bias heat energy error and the image heat energy error. It is also possible to change the width of the bias drive pulses to compensate for the heat energy errors. Furthermore, the number or width of the bias drive pulses can be changed for compensating for the bias heat energy error. The number or width of the image drive pulses can be changed for compensating for the image heat energy error.

The present invention is applicable a separate type of resistance data measure device which would be a part of the above-described thermal printer and would be detached from it. This resistance data measure device is usable as a tool or instrument for inspecting the thermal head.

In the above embodiments, the resistance data is measured in the factory for adjustment after manufacture and assembly. The present invention is also applicable to an automatic measuring operation of the resistance data. The automatic operation can be triggered in the printer upon powering the printer by a user's manual operation, or upon lapse of a period predetermined suitably.

In the above embodiments, the capacitor is charged up to the predetermined high voltage V1 at the highest. It is also possible to charge the capacitor to a voltage slightly higher than the predetermined high voltage V1.

The above embodiments are applied to a color thermal printer of a direct recording type. The present invention is also applicable to a monochromatic thermal printer, or a color thermal printer of a thermal transfer type. The above embodiments are directed to a line printer in which the thermal head is moved one-dimensionally relative to the recording sheet. The present invention is applicable to a serial printer in which the thermal head is moved two-dimensionally relative to the recording sheet. The present invention is also applicable to a three-head/one-pass type of color thermal printer including three thermal heads for the yellow, magenta and cyan.

In the above embodiments, the resistance data of all the heating elements are determined. The present invention is applicable to determining resistance data of only at least one of the heating elements. For this operation, the discharging time measured via the reference resistor 52 and discharging time measured via the at least one heating element are considered, or the charging time measured via the reference resistor 70 and discharging time measured via the at least one heating element are considered.

Although the present invention has been fully described by way of the preferred embodiments thereof with reference to the accompanying drawings, various changes and modifications will be apparent to those having skill in this field. Therefore, unless otherwise these changes and modifications depart from the scope of the present invention, they should be construed as included therein.

What is claimed is:

1. A resistance data measuring method for a thermal head, said thermal head having plural heating elements arranged along a line and connected in parallel with one another, a respective one of said heating elements being connected to one of plural heat control switches, said heat control switches being selectively turned on/off for driving said heating elements individually by applying electrical energy to generate heat, said resistance data measuring method comprising steps of:

connecting a capacitor in parallel with said plural heating elements;

charging said capacitor;

detecting a capacitor voltage across said capacitor;

measuring charging time elapsed in an increase of said capacitor voltage from a predetermined low voltage to a predetermined high voltage while said capacitor is charged;

discharging said capacitor via one of said heating elements;

measuring discharging time elapsed in a decrease of said capacitor voltage from said predetermined high voltage to said predetermined low voltage while said capacitor is discharged, in association respectively with said heating elements; and determining resistance data of said heating elements in accordance with said discharging time with reference to said charging time.

2. A resistance data measuring method as defined in claim 1, wherein said capacitor stops being charged upon an increase of said capacitor voltage to said predetermined high voltage while said capacitor is being charged.

3. A resistance data measuring method as defined in claim 2, wherein said capacitor is charged via a reference resistance connected thereto;

wherein said resistance data is a ratio of said discharging time of each of said heating elements to said charging time of said reference resistor, and represents a relative greatness of resistance.

4. A resistance data measuring method as defined in claim 3, wherein said voltage detecting step includes comparing said capacitor voltage with a first reference voltage set equal to said predetermined high voltage, and with a second reference voltage set equal to said predetermined low voltage, to generate a detection signal when said capacitor voltage is between said first and second reference voltages;

further comprising steps of:

starting measurement of time in response to a start of generation of said detection signal; and finishing said measurement of time in response to an end of said generation of said detection signal.

* * * * *